(12) United States Patent
Kumar et al.

(10) Patent No.: US 12,160,237 B2
(45) Date of Patent: Dec. 3, 2024

(54) INTEGRATED CIRCUIT WITH OUTPUT DRIVER THAT COMPENSATES FOR SUPPLY VOLTAGE VARIATIONS

(71) Applicant: STMicroelectronics International N.V., Geneva (CH)

(72) Inventors: Kailash Kumar, Hazaribagh (IN); Ravinder Kumar, Ambala (IN)

(73) Assignee: STMicroelectronics International N.V., Geneva (CH)

( * ) Notice: Subject to any disclaimer, the term of this patent is extended or adjusted under 35 U.S.C. 154(b) by 179 days.

(21) Appl. No.: 17/843,693

(22) Filed: Jun. 17, 2022

(65) Prior Publication Data

US 2022/0416792 A1 Dec. 29, 2022

Related U.S. Application Data

(60) Provisional application No. 63/214,721, filed on Jun. 24, 2021.

(51) Int. Cl.
*H03K 19/0185* (2006.01)
*H03K 19/003* (2006.01)
(52) U.S. Cl.
CPC ........... *H03K 19/018521* (2013.01); *H03K 19/00384* (2013.01)

(58) Field of Classification Search
CPC .......... H03K 19/018521; H03K 19/00384
See application file for complete search history.

(56) References Cited

U.S. PATENT DOCUMENTS

| | | | |
|---|---|---|---|
| 6,586,974 B1 * | 7/2003 | Humphrey | H03K 19/018521 326/82 |
| 7,145,364 B2 | 12/2006 | Bhattacharya et al. | |
| 7,834,654 B2 | 11/2010 | Millar | |
| 7,876,123 B2 | 1/2011 | Bhakta et al. | |
| 7,893,720 B2 | 2/2011 | Yadav et al. | |
| 9,337,660 B1 * | 5/2016 | Bourstein | H02J 4/00 |
| 9,525,421 B2 | 12/2016 | Potluri | |
| 2016/0094217 A1 * | 3/2016 | Garg | H03K 17/687 327/108 |

FOREIGN PATENT DOCUMENTS

EP 0765035 B1 12/2001

* cited by examiner

*Primary Examiner* — Daniel D Chang
(74) *Attorney, Agent, or Firm* — Seed IP Law Group LLP

(57) ABSTRACT

An integrated circuit includes an output pad, and I/O driver that drives data to the output pad, and a predriver that controls the I/O driver. The integrated circuit includes maximum voltage generator that receives a first supply voltage and a second supply voltage and outputs to the predriver a maximum voltage corresponding to the higher of the first supply voltage and the second supply voltage.

18 Claims, 3 Drawing Sheets

INTEGRATED CIRCUIT WITH OUTPUT DRIVER THAT COMPENSATES FOR SUPPLY VOLTAGE VARIATIONS

BACKGROUND

Technical Field

The present disclosure is related to integrated circuits, and more particularly to input/output (I/O) circuits of integrated circuits.

Description of the Related Art

Integrated circuits include I/O pads. An I/O pad may receive data from a circuit or device external to the integrated circuit. The integrated circuit includes driver circuitry that passes data from the core transistor to the I/O pad external to the integrated circuit. The core transistors may process the input data and may generate output data. The driver circuitry passes the output data from the core to the I/O pad.

In many cases, serial interface protocols govern the parameters of data reception and transition the I/O pads. The serial interface protocols may specify a maximum total loop delay. The total loop delay corresponds to the time that elapses between input data being received at an I/O pad from external circuit and output data being provided to the I/O pad from the core of the integrated circuit responsive to the input data.

It is possible that variations in supply voltage may cause the total loop delay of the integrated circuit to be larger than the maximum loop delay allowed by the serial interface protocols. If this happens, then there may be communication failures between the integrated circuit and the external circuit.

BRIEF SUMMARY

Embodiments of the present disclosure provide an integrated circuit having I/O transmitter circuitry that helps maintain a small total loop delay even when there are undesirable variations in supply voltages. The integrated circuit includes a core supply voltage and an I/O supply voltage. The integrated circuit includes a maximum voltage generator that generates a maximum voltage corresponding to the higher of the core supply voltage and the I/O supply voltage. The integrated circuit supplies the maximum voltage to the I/O transmitter circuitry.

Thus, if supply voltage variations result in the I/O supply voltage dropping below the core supply voltage, then the maximum voltage generator will select the core supply voltage to be provided to the I/O transmitter circuitry. This ensures that the I/O transistor circuitry will have a high enough supply voltage to drive output data to the I/O pad with sufficient speed to maintain a sufficiently small total loop delay.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc., to avoid unnecessarily obscuring descriptions of the embodiments. Further, well-known components and circuits associated with memory arrays have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
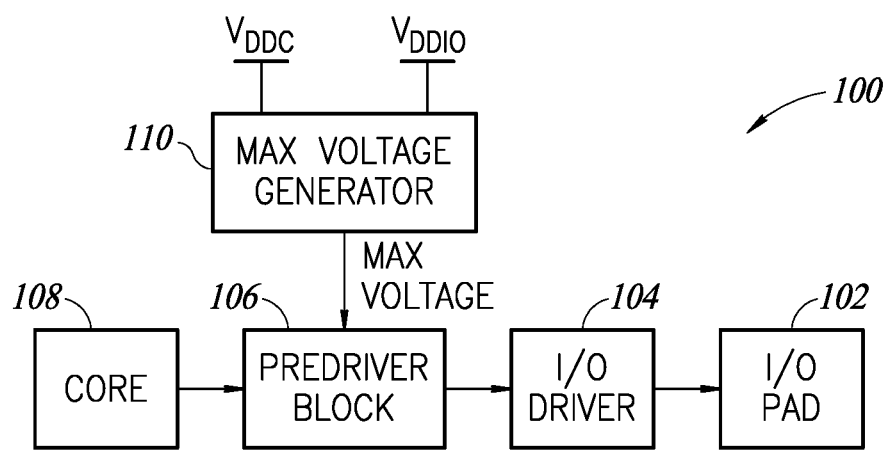
FIG. 1 is a block diagram of an integrated circuit, in accordance with some embodiments.

FIG. 1 is a block diagram of an integrated circuit 100, according to one embodiment. The integrated circuit 100 includes an I/O pad 102, an I/O driver 104, a predriver block 106, a core 108, and a maximum voltage generator 110. As will be set forth in more detail below, the maximum voltage generator 110 helps the components of the integrated circuit 100 to compensate for variations in supply voltages.

The I/O pad 102 is a terminal of the integrated circuit 100. The I/O pad 102 receives data and other signals from devices external to the integrated circuit 100. The I/O pad also provides data and other signals to devices external to the integrated circuit 100.

The I/O pad 102 may be connected via wire bonding to a pin of a lead frame. Data may be provided to and received from the integrated circuit 100 via the pin. Other types of connections can be used to enable external devices to communicate with the I/O pad 102 without departing from the scope of the present disclosure.

The core 108 processes data received through a receiver via the I/O pad 102. The core 108 can include processing circuitry. The core 108 can include circuitry that writes data to memory and that reads data from memory. The core 108 can include circuitry that executes software instructions.

The core 108 can include a large number of transistors coupled together in complex arrangements. The transistors cooperate to process data, to write data to memory, to read data from memory, and to execute software instructions. The transistors can be coupled together by metal interconnects formed in the integrated circuit 100.

Because there may be a large number of transistors performing a large number of tasks, it is possible that the transistors of the core 108 can utilize a large amount of power. The high-power usage can result in the generation of large amounts of heat. This can be problematic if the integrated circuit 100 is not able to safely dissipate the heat generated by the core 108.

In order to reduce the amount of heat generated by the transistors of the core 108, the transistors of the core 108 may operate on relatively low voltages. In particular, the core 108 may operate on a core supply voltage VDDc. The core supply voltage VDDc may be between 1.0 V and 2.0 V, though other core supply voltages can be utilized without departing from the scope of the present disclosure. Smaller core supply voltage values result in smaller amounts of power utilized by the transistors of the core 108.

The transistors of the core 108 may include relatively thin gate dielectrics. For example, the gate dielectrics of the transistors in the core 108 may include thicknesses between 10 Å and 20 Å. Other thicknesses for the gate dielectrics of the transistors in the core 108 can be utilized without departing from the scope of the present disclosure.

The predriver block 106 facilitates the passing of data signals from core 108 to the I/O driver 104. In one embodiment, the predriver block 106 and the I/O driver 104 include one or more PMOS transistors and one or more NMOS transistors. The NMOS and PMOS transistors can be enabled in order to pass signals from the core 108 to the I/O pad 102.

The I/O driver 104 provides signals to the I/O pad 102. The signals can include data to be passed from the I/O pad 102 to a circuit or device external to the integrated circuit 100. The I/O driver 104 can include a plurality of transistors, such as one or more NMOS and PMOS transistors. The NMOS and PMOS transistors can be selectively operated to provide data to the I/O pad 102. By selectively enabling the NMOS and PMOS transistors, data can be provided to the I/O pad by modulating an output voltage of the I/O driver between a high logic value and a low logic value.

The predriver block 106 controls the I/O driver 104. The predriver block 106 can receive signals and data from the core 108. The predriver block 106 provides the data to the I/O pad 102 by selectively controlling the NMOS and PMOS transistors of the I/O driver 104 to modulate an output voltage provided by the I/O driver 104 to the I/O pad 102. The modulated voltage can correspond to the signals and data provided from the core 108 to the I/O pad 102.

The I/O driver 104 and the predriver block 106 can operate at an I/O supply voltage VDDio. The I/O supply voltage VDDio is generally higher than the relatively low core supply voltage VDDc utilized by the core 108. The I/O supply voltage VDDio can include values between 2.5 V and 5.5 V, though other values can be utilized for the I/O supply voltage VDDio without departing from the scope of the present disclosure.

Because the analog predriver block 106 and the I/O driver 104 operate at a supply voltage that is higher than the core voltage supply, the transistors of the analog predriver block 106 and the I/O driver 104 may have gate dielectric thicknesses that are higher than the gate dielectric thicknesses of the transistors of the core 108. In one example, the transistors of the I/O driver 104 and the predriver block 106 have gate dielectric thicknesses between 25 Å and 35 Å.

Although the I/O supply voltage VDDio is typically higher than VDDc, in some cases there may be variations in VDDio and VDDc. VDDio may temporarily be lower than VDDc. If the predriver block 106 is driven by VDDio when VDDio is low, then an under drive situation may occur. An under drive situation occurs when the supply voltage that drives the transistor is only slightly larger than or even less than the threshold voltage of the transistor. In an under drive situation, the predriver block 106 may not be able to supply sufficiently high currents to properly drive the transistors of the I/O driver 104.

Under drive situations can result in various problems for the integrated circuit 100. If the predriver block 106 cannot provide sufficient currents or voltages to the gate terminals of the transistors of the I/O driver 104, then the I/O driver 104 may not be able to quickly provide data to the I/O pad 102. This may cause the total delay of the integrated circuit 100 to be longer than a total loop delay tolerance specified by serial interface protocols. Another potential problem is that low currents and voltages from the predriver block 106 may cause short circuits in the I/O driver 104. A transistor of the I/O driver 104 that is supposed to be turned off may not be entirely turned off, resulting in a short circuit in the I/O driver.

In order to reduce the risk of under drive situations, the integrated circuit 100 includes the max voltage generator 110. The max voltage generator 110 receives the I/O supply voltage VDDio and the core supply voltage VDDc. The max voltage generator 110 outputs a maximum voltage signal. The maximum voltage signal is the higher of the I/O supply voltage VDDio and the core supply voltage VDDc. The maximum voltage generator 110 supplies the max voltage signal to the pre-driver block 106.

In one embodiment, the max voltage generator 110 compares the I/O supply voltage VDDio to the core supply voltage VDDc. The max voltage generator 110 selects as the maximum voltage signal the higher of the I/O supply voltage VDDio and the core supply voltage VDDc. The max voltage generator 110 supplies the maximum voltage signal to the predriver block 106.

Because the predriver block 106 receives the maximum voltage signal, the predriver block 106 can control the I/O driver 104 with whichever of the supply voltages is higher. This can reduce the risk that an under drive situation can occur. This can help ensure that total loop delay tolerances in accordance with serial interface protocol standards are met.

Figure 2:
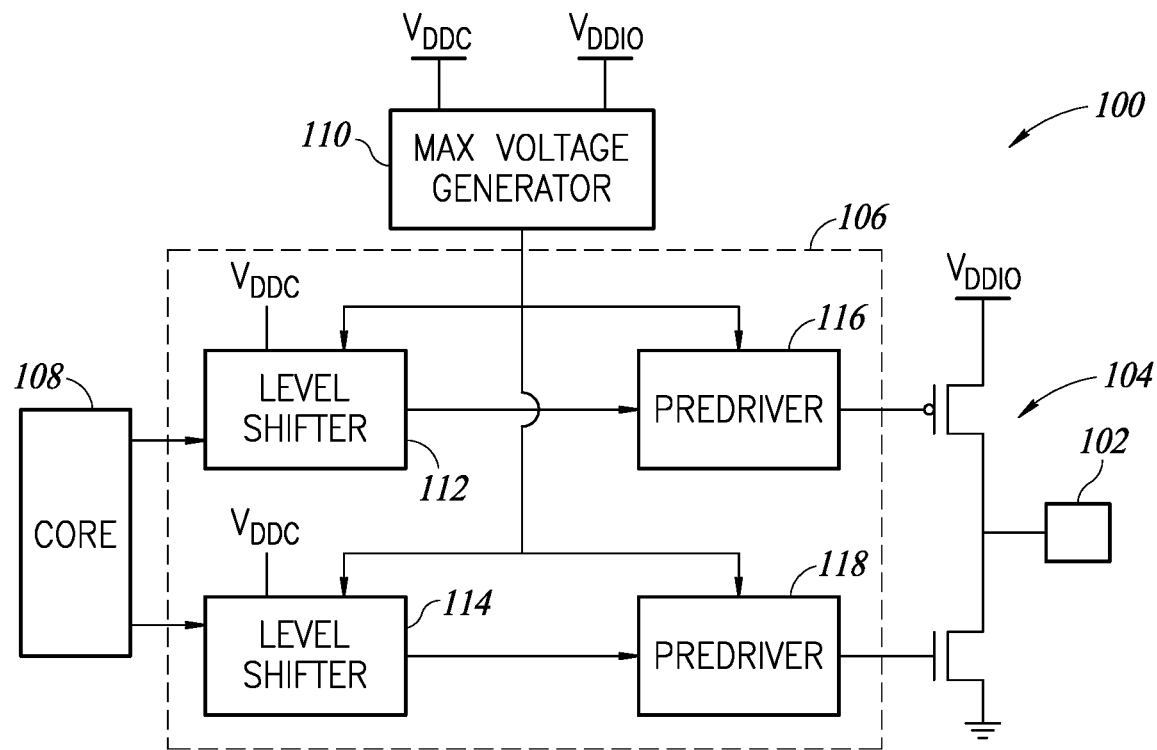
FIG. 2 is a block diagram of an integrated circuit including a maximum voltage generator, in accordance with some embodiments.

FIG. 2 is a block diagram of an integrated circuit 100, in accordance with one embodiment. The integrated circuit 100 includes an I/O pad 102, an I/O driver 104, a predriver block 106, a core 108, and a max voltage generator 110. In the example of FIG. 2, the predriver block 106 and the I/O driver 104 correspond to a transmitter block. The predriver block 106 controls the transmission from the I/O pad 102. While the present disclosure primarily describes using a maximum voltage generator 110 with transmission or output circuitry, principles of the present disclosure can also apply to receiver circuitry that controls the reception of input data from the I/O pad 102.

The core 108 supplies data to the predriver block 106. The core 108 may supply data via one or more multiplexers. The one or more multiplexers may receive data from a plurality of core outputs. The one or more multiplexers supply data to the predriver block 106 from one of the core outputs at a time. The core 108 is driven by the core supply voltage VDDc.

The predriver block 106 includes a first level shifter 112, a second level shifter 114, a first predriver 116, and a second predriver 118. The level shifter 112, the level shifter 114, the predriver 116, and the predriver 118 all receive the maximum voltage from the maximum voltage generator 110.

The level shifter 112 receives a data value from the core 108. The data value received from the core 108 is that the core supply voltage VDDc. This means that if a data signal corresponding to a data value of 1 is received, then the data signal will have a value of VDDc. If the data signal has a data value corresponding to 0, then the data signal will have a value of ground. The level shifter 112 shifts the data signal from VDDc to the maximum voltage. Under typical circumstances, VDDio is greater than VDDc. Accordingly, under typical circumstances the level shifter 112 will level shift the data signal from VDDc to VDDio because the maximum voltage will normally be VDDio. However, if VDDio has for some reason been reduced to a value below VDDc, then the maximum voltage signal will correspond to VDDc and the level shifter will output the data value at the level of VDDc. This helps reduce the risk of an under-voltage situation in a circumstance in which VDDio has been significantly reduced.

A traditional level shifter does voltage conversion unidirectionally. This can mean either low to high or high to low voltage conversion. In transmitter generally low voltage VDDc to high voltage VDDio level-shifters are used. A traditional level shifter will shift the data signal from VDDc to VDDio. If VDDio has dropped below VDDc would result in an under drive situation and lead to functional failure of level-shifter. However, with the help of the max voltage generator 110, the level shifters 112 and 114 avoid the situation and always output data signals at the value of the maximum voltage. The level shifter 114 operates substantially identically to the level shifter 112.

Before describing the function of the predriver 116, the I/O driver 104 will first be described. The I/O driver 104 includes a transistor of a first conductivity type P1, such as a PMOS transistor and a transistor of a second conductivity type N1, such as an NMOS transistor where the second conductivity type is different than the first conductivity type. The transistor P1 has a source terminal connected to VDDio, a gate terminal coupled to the predriver 116, and a drain terminal coupled to the I/O pad 102. The transistor N1 has a source terminal coupled to ground, a gate terminal coupled to the predriver 118, and a drain terminal coupled to the I/O pad 102.

If the core 108 provides a data value of 1 to be provided to the I/O pad 102, then the predriver 116 will supply a low voltage that turns on the transistor P1. The predriver 118 will supply a low-voltage that turns off the transistor N1. With the transistor P1 turned on, the I/O pad 102 is connected to VDDio via the transistor P1.

If the core 108 provides a data value of 0 to be provided to the I/O pad 102, then the predriver 116 will supply a high voltage that turns off the transistor P1 and the predriver 118 will supply a high voltage that turns on the transistor N1. With the transistor N1 turned on, the I/O pad 102 is connected to ground via the transistor N1.

The predrivers 116 and 118 carefully drive the gate terminals of the transistors P1 and N1 to avoid short circuits. In particular, the predrivers 116 and 118 help ensure that the transistor P1 and the transistor N1 are never on at the same time. If the transistor P1 and the transistor N1 are on at the same time, then there will be a short circuit between VDDio and ground. This can result in very high currents that damage the transistors P1 and N1. Accordingly, the predriver 116 and the predriver 118 carefully control the slew rates at the gate terminals of P1 and N1. If a data value of 1 is to be provided to the I/O pad 102, the predriver 116 and the predriver 118 operate to ensure that the transistor N1 is turned off before the transistor P1 is turned on. If a data value of 0 is to be provided to the I/O pad 102, the predriver 116 and the predriver 118 operate to ensure that the transistor P1 is turned off before the transistor N1 is turned on.

If the predrivers 116 and 118 are driven by low voltages, there will be delays in turning on the transistors P1 and N1. This is because the gate terminals of the transistors P1 and N1 are relatively large and high currents are utilized to quickly charge the gate terminals of the transistors P1 and N1. If the predrivers 116 and 118 are supplied with a low supply voltage, then they will not be able to quickly charge the gate terminals of the transistors P1 and N1. This leads to delays in data being provided to the I/O pad 102.

To ensure that the predrivers 116 and 118 are not powered by low voltages, the max voltage generator 110 provides the maximum voltage to both the predriver 116 and the predriver 118. The result is that the predrivers 116 and 118 have sufficiently large supply voltages to properly drive the transistors P1 and N1. This enables the integrated circuit to have total loop delays that comply with total loop delay tolerances specified by serial interface protocols.

Figure 3:
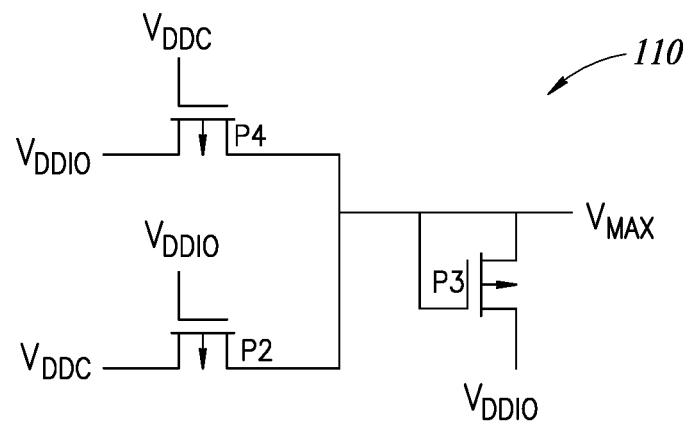
FIG. 3 is a schematic diagram of a maximum voltage generator, in accordance with some embodiments.

FIG. 3 is a schematic diagram of the max voltage generator 110, according to one embodiment. The max voltage generator 110 of FIG. 3 is one embodiment of the max voltage generator 110 of the overvoltage protection circuit 112 of FIG. 1. Other embodiments for a max voltage generator 110 can be utilized without departing from the scope of the present disclosure.

The max voltage generator 110 receives as input signals the I/O supply voltage VDDio and the core supply voltage VDDc. The max voltage generator 110 outputs a max voltage signal VMAX corresponding to the higher voltage between VDDio and the VDDc. Accordingly, the max voltage generator 110 effectively compares the I/O supply voltage VDDio to the core supply voltage VDDc and outputs the higher voltage between VDDc and VDDio.

The max voltage generator 110 includes a PMOS transistor P2, a PMOS transistor P3, and a PMOS transistor P4. The PMOS transistors P2, P3, and P4 are coupled together and receive voltage signals on their terminals such that the PMOS transistors P2, P3, and P4 output VMAX.

The PMOS transistor P4 receives on a source terminal the I/O supply voltage VDDio. The PMOS transistor P4 receives the core supply voltage VDDc on its gate terminal. The PMOS transistor P4 receives voltage VMAX on its body terminal. The drain terminal of the PMOS transistor P4 is coupled to the drain terminal of the PMOS transistor P2 and to the source and gate terminals of the PMOS transistor P3. The drain terminal of the PMOS transistor P4 outputs VMAX. The body terminal connections of the various transistors are not shown in FIGS. 3, but are described herein.

The PMOS transistor P2 receives the core supply voltage VDDc on a source terminal. The PMOS transistor P2 receives the I/O supply voltage VDDio on its gate terminal. The PMOS transistor P2 receives the voltage VMAX on its body terminal.

The PMOS transistor P3 receives on its gate and source terminals VMAX. The PMOS transistor P3 receives on its drain terminal VDDio. The PMOS transistor P3 receives the voltage VMAX on its body terminal.

If VDDc is greater than VDDio, then the PMOS transistor P4 has a positive gate to source voltage. In this state, the PMOS transistor P4 is disabled. If VDDc is greater than VDDio then the PMOS transistor P2 has a negative gate to source voltage and the PMOS transistor P2 is enabled. When the PMOS transistor P2 is enabled, then VDDc is supplied on the drain terminal of the PMOS transistor P2. In this case, VDDc is applied as VMAX because VDDc is greater than VDDio.

If VDDio is greater than VDDc, then the PMOS transistor P2 has a positive gate to source voltage and the PMOS transistor P2 is disabled. If VDDio is greater than VDDc, then the PMOS transistor P4 has a negative gate to source voltage. In this state, the PMOS transistor P4 is enabled. When the PMOS transistor P4 is enabled, then VDDio is supplied on the drain terminal of the PMOS transistor P4. In this case, VDDio is supplied as VMAX because VDDio is greater than VDDc.

The max voltage generator 110 supplies VMAX to the level shifter 112, the level shifter 114, the predriver 116, and the predriver 118. The max voltage generator 110 in FIG. 3 is one embodiment of a circuit that can output a voltage VMAX corresponding to the higher of VDDc and VDDio. Those of skill in the art will recognize, in light of the present disclosure, that other circuit configurations can be utilized to generate VMAX without departing from the scope of the present disclosure.

Figure 4:
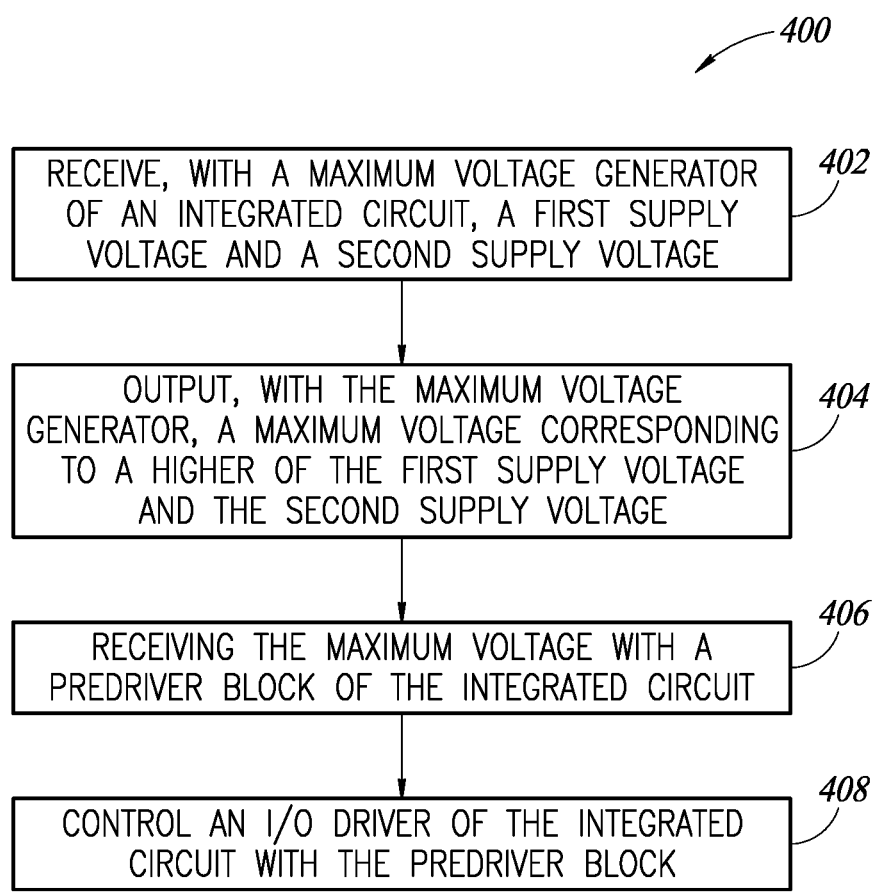
FIG. 4 is a flow diagram of a method for operating an integrated circuit, in accordance with some embodiments.

FIG. 4 is a flow diagram of a method 400 for operating an integrated circuit, in accordance with some embodiments. At 402, the method 400 includes receiving, with a maximum voltage generator of an integrated circuit, a first supply voltage and a second supply voltage. At 404, the method 400 includes outputting, with the maximum voltage generator, a maximum voltage corresponding to a higher of the first supply voltage and the second supply voltage. At 406, the method 400 includes receiving the maximum voltage with a predriver block of the integrated circuit. At 408, the method 400 includes controlling an I/O driver of the integrated circuit with the predriver block.

In one embodiment, an integrated circuit includes an output pad, an output driver coupled to the output pad, and a predriver block coupled to the output driver. The integrated circuit includes a maximum voltage generator coupled to the predriver block. The maximum voltage generator is configured to receive a core supply voltage and an input/output (I/O) supply voltage and to supply a maximum voltage to the predriver block.

In one embodiment, an integrated circuit includes an output pad and an I/O driver coupled to the output pad. The integrated circuit includes a maximum voltage generator that receives a core supply voltage and an I/O supply voltage and outputs a maximum voltage corresponding to a higher of the core supply voltage and the I/O supply voltage. The integrated circuit includes a core that provides a data value and a predriver block that receives the data value and the maximum voltage and controls the I/O driver to drive the data value at the output pad.

In one embodiment, a method includes receiving, with a maximum voltage generator of an integrated circuit, a first supply voltage and a second supply voltage and outputting, with the maximum voltage generator, a maximum voltage corresponding to a higher of the first supply voltage and the second supply voltage. The method includes receiving the maximum voltage with a predriver block of the integrated circuit and controlling an I/O driver of the integrated circuit with the predriver block.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
   an output pad;
   an output driver coupled to the output pad;
   a predriver block coupled to the output driver;
   a maximum voltage generator coupled to the predriver block, wherein the maximum voltage generator is configured to receive a core supply voltage and an input/output (I/O) supply voltage, to compare the core supply voltage to the I/O supply voltage, to select a maximum voltage corresponding to a higher of the core supply voltage and the I/O supply voltage based on the comparison, and to supply the maximum voltage to the predriver block; and
   a core including a plurality of core transistors powered by the core supply voltage, wherein:
      the predriver block is coupled to the core, receives data from the core and controls the output driver to output the data on the output pad;
      the predriver block includes a first level shifter that receives the maximum voltage and the data and shifts the data to a level of the maximum voltage; and
      the predriver block includes a first predriver coupled to the first level shifter, wherein the first predriver receives the level shifted data from the first level shifter and receives the maximum voltage and controls the output driver based on the level shifted data.

2. The integrated circuit of claim 1, wherein the predriver block includes a second level shifter that receives the maximum voltage and complimentary data from the core and shifts the complimentary data to a level of the maximum voltage, wherein the complimentary data is a logical compliment of the data.

3. The integrated circuit of claim 2, wherein the predriver block includes a second predriver coupled to the second level shifter, wherein the second predriver receives the level shifted complimentary data from the second level shifter and receives the maximum voltage and controls the output driver based on the complimentary level shifted data.

4. The integrated circuit of claim 3, wherein the output driver includes:
   a PMOS transistor having a source terminal coupled the I/O supply voltage, a drain terminal coupled to the output pad, and a gate terminal coupled to the first predriver; and
   an NMOS transistor having a source terminal coupled to ground, a drain terminal coupled to the output pad, and a gate terminal coupled to the second predriver.

5. The integrated circuit of claim 4, wherein the first predriver controls a slew rate of the gate terminal of the PMOS transistor based on the level shifted data.

6. The integrated circuit of claim 5, wherein the second predriver controls a slew rate of the gate terminal of the NMOS transistor based on the level shifted complimentary data.

7. An integrated circuit, comprising:
   an output pad;
   an I/O driver coupled to the output pad;
   a maximum voltage generator that receives a core supply voltage and an I/O supply voltage and outputs a maximum voltage corresponding to a higher of the core supply voltage and the I/O supply voltage;
a core that provides a data value; and a predriver block that receives the data value and the maximum voltage and controls the I/O driver to drive the data value at the output pad, wherein the maximum voltage generator includes:
a first transistor that receives the I/O supply voltage on a source terminal and receives the core supply voltage on a gate terminal;
a second transistor that receives the core supply voltage on a source terminal and receives the I/O supply voltage on a gate terminal;
an output coupled to a drain terminal of the first transistor; and
a third transistor having a source terminal coupled to the output, a gate terminal coupled to the output, and a drain terminal that receives the I/O supply voltage.

8. The integrated circuit of claim 7, wherein:
the predriver block includes a first level shifter that receives the maximum voltage and the data and shifts the data value to a level of the maximum voltage; and
the predriver block includes a first predriver coupled to the first level shifter, wherein the first predriver receives the level shifted data from the first level shifter and receives the maximum voltage and controls the I/O driver based on the level shifted data.

9. The integrated circuit of claim 8, wherein the predriver block includes a second level shifter that receives the maximum voltage and complimentary data from the core and shifts the complimentary data to a level of the maximum voltage, wherein the complimentary data is a logical compliment of the data.

10. The integrated circuit of claim 9, wherein the predriver block includes a second predriver coupled to the second level shifter, wherein the second predriver receives the level shifted complimentary data from the second level shifter and receives the maximum voltage and controls the I/O driver based on the complimentary level shifted data.

11. A method, comprising:
receiving, with a maximum voltage generator of an integrated circuit, a first supply voltage and a second supply voltage; comparing, with the maximum voltage generator, the first supply voltage to the second supply voltage;
outputting, with the maximum voltage generator, a maximum voltage corresponding to a higher of the first supply voltage and the second supply voltage based on the comparison;
receiving the maximum voltage with a predriver block of the integrated circuit;
powering, with the first supply voltage, a core of the integrated circuit including a plurality of transistors;
receiving, with a first level shifter of the predriver block, data from the core and the maximum voltage;
shifting, with the first level shifter, the data to a level of the maximum voltage;
receiving, with a first predriver of the predriver block, the level shifted data and the maximum voltage; and
controlling, with the predriver block, an I/O driver of the integrated circuit to output the level shifted data on an output pad of the integrate circuit.

12. The method of claim 11, further comprising controlling, with the predriver, a gate terminal of a transistor of the I/O driver based on the level shifted data.

13. The method of claim 11, wherein the predriver block includes a second level shifter that receives the maximum voltage and complimentary data from the core and shifts the complimentary data to a level of the maximum voltage, wherein the complimentary data is a logical compliment of the data.

14. The method of claim 13, wherein the predriver block includes a second predriver coupled to the second level shifter, wherein the second predriver receives the level shifted complimentary data from the second level shifter and receives the maximum voltage and controls the I/O driver based on the complimentary level shifted data.

15. The method of claim 14, wherein the I/O driver includes:
a PMOS transistor having a source terminal coupled the I/O supply voltage, a drain terminal coupled to the output pad, and a gate terminal coupled to the first predriver; and
an NMOS transistor having a source terminal coupled to ground, a drain terminal coupled to the output pad, and a gate terminal coupled to the second predriver.

16. The method of claim 15, wherein the first predriver controls a slew rate of the gate terminal of the PMOS transistor based on the level shifted data.

17. The method of claim 16, wherein the second predriver controls a slew rate of the gate terminal of the NMOS transistor based on the level shifted complimentary data.

18. The method of claim 11, wherein the first supply voltage is a core supply voltage and the second supply voltage is an I/O supply voltage.

* * * * *